(12) United States Patent
Choy et al.

(10) Patent No.: US 6,635,112 B1
(45) Date of Patent: Oct. 21, 2003

(54) FABRICATION APPARATUS FOR FABRICATING AN OBJECT AS A PLURALITY OF SUCCESSIVE LAMINAE

(75) Inventors: Kwang-Leong Choy, Coventry (GB); Wei Bai, Guilderland, NY (US); Issac Chang, Coventry (GB)

(73) Assignee: Innovative Materials Processing Technologies Limited, London (GB)

( * ) Notice: Subject to any disclaimer, the term of this patent is extended or adjusted under 35 U.S.C. 154(b) by 0 days.

(21) Appl. No.: 09/698,620

(22) Filed: Oct. 27, 2000

Related U.S. Application Data

(62) Division of application No. 09/371,872, filed on Aug. 6, 1999, now Pat. No. 6,180,186, which is a continuation of application No. PCT/GB98/00414, filed on Feb. 10, 1998.

(30) Foreign Application Priority Data

Feb. 10, 1997 (GB) .............................. 9702658

(51) Int. Cl.$^7$ ................................. B05C 5/00
(52) U.S. Cl. .................. 118/620; 118/641; 118/300
(58) Field of Search ................. 118/300, 620, 118/641; 427/385.5, 402, 421, 512, 555, 558, 559

(56) References Cited

U.S. PATENT DOCUMENTS

| | | | |
|---|---|---|---|
| 5,002,854 A | * | 3/1991 | Fan et al. .................. 264/482 |
| 5,352,310 A | | 10/1994 | Natter |
| 5,498,444 A | * | 3/1996 | Hayes .......................... 347/1 |

FOREIGN PATENT DOCUMENTS

| | | |
|---|---|---|
| DE | 4325 573 A1 | 2/1995 |
| EP | 0 467 097 A1 | 1/1992 |
| WO | WO 88/02677 | 4/1988 |
| WO | WO 96/00412 | 1/1992 |
| WO | WO 92/10343 | 6/1992 |
| WO | WO 92/16343 | 10/1992 |
| WO | WO 92/20014 | 11/1992 |
| WO | WO 93/02846 | 2/1993 |
| WO | WO 93/20993 | 10/1993 |

OTHER PUBLICATIONS

Ryu, et al., "Fabrication of ZNO Thin Films Using Charged Liquid Cluster Beam Technique", Applied Physics Letters, vol. 67, No. 22, Nov. 27, 1995.

* cited by examiner

*Primary Examiner*—Laura Edwards
(74) *Attorney, Agent, or Firm*—Frommer Lawrence & Haug, LLP; William S. Frommer; Thomas J. Kowalski

(57) ABSTRACT

Fabrication apparatus for fabricating an object as a plurality of successive laminae, the apparatus comprising: a nozzle comprising a precursor outlet for applying an aerosol or gaseous precursor onto a recipient surface; a heater for providing a temperature gradient along an application path of the precursor, so that the precursor is heated as it approaches the recipient surface and a transformation initiated so that a material layer of transformed material is deposited on the recipient surface; and a directable light beam for locally heating regions of the material layer so as to further transform the locally-heated regions to a solid material.

7 Claims, 1 Drawing Sheet

Figure 1:
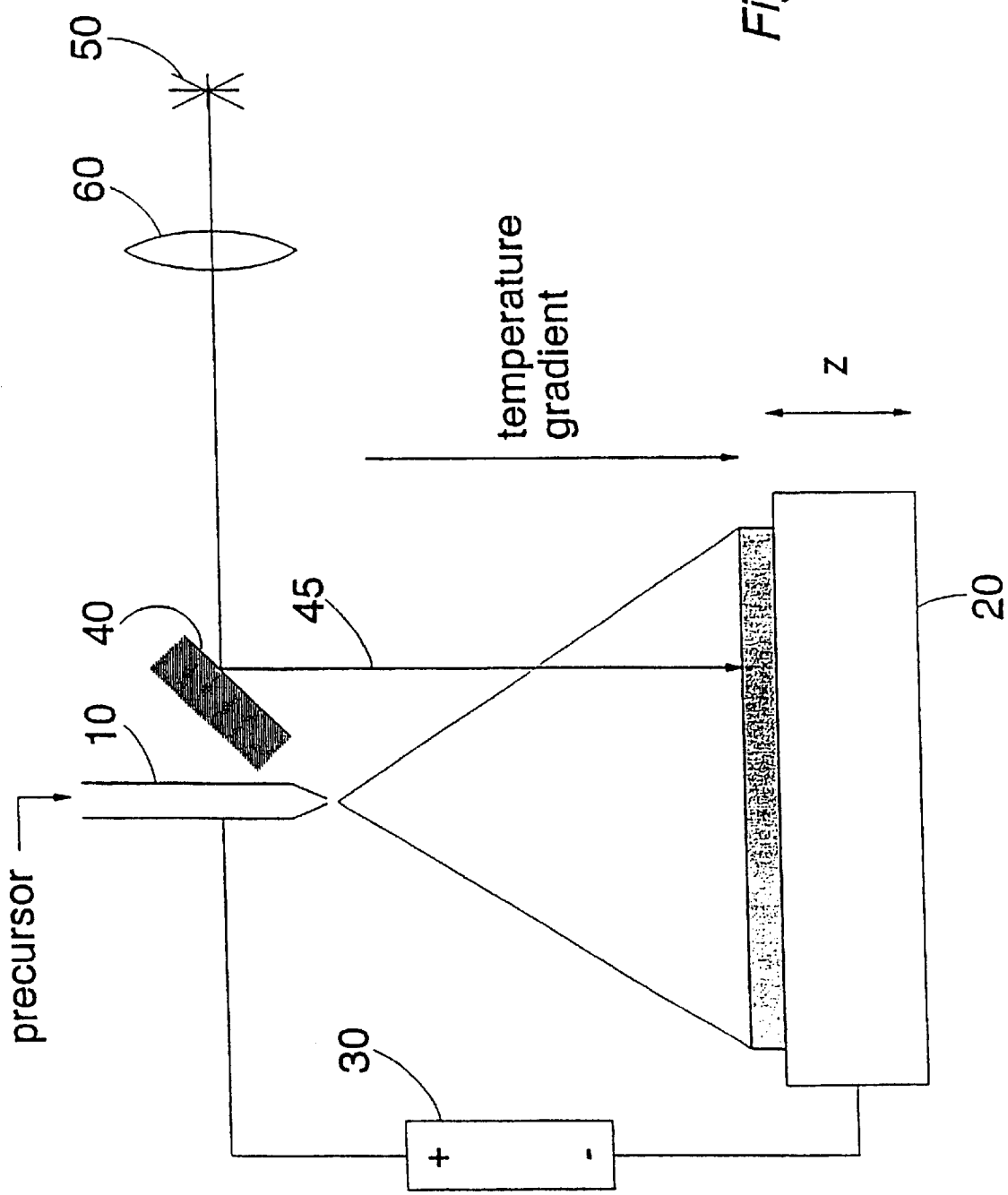

FABRICATION APPARATUS FOR FABRICATING AN OBJECT AS A PLURALITY OF SUCCESSIVE LAMINAE

This is a Divisional of application Ser. No. 09/371,872, filed Aug. 6, 1999, now U.S. Pat. No. 6,180,186, which is a Continuation of International Application PCT/GB98/00414 having an international filing date of Feb. 10, 1998.

This invention relates to methods and apparatus for the fabrication of objects.

In the current competitive domestic, industrial and military markets, the commercial lifetimes of products are continually decreasing and their design complexity is increasing. This has led to an ever-increasing need for rapid prototyping technology in the manufacturing industries. Rapid prototyping has already demonstrated its ability to reduce a product's development time, and to allow manufacturers to react faster and more flexibly to meet the demands of the rapidly changing markets.

At present, there are various types of commercially available rapid prototyping methods, such as (a) selective laser curing of liquid monomers, usually within a pool of the liquid (Stereo lithography, SLA) [see publication reference 1], (b) selective laser sintering (SLS) of powders (e.g. polymers, resin coated metal and sand) [1] and (c) layer object manufacturing (LOM) [2] which involves the laser cutting and adhesive bonding of sheets of papers or slip casting of ceramic tapes. These methods have been used to produce prototypes of new designs for evaluation and testing. In addition, they have successfully produced patterns for casting or plastic moulding tools needed for the manufacturing of prototypes of design products or short run products.

However, the parts that are made by these methods always suffer from low mechanical strength due to poor density or excessive resin, and so require additional process steps such as debinding of resin, and heat treatment for densification. This may lead to undesirable shrinkage resulting in poor dimensional control. In addition, these methods are limited to a selected range of materials—generally being limited to use only with polymers.

In the SLA method, the monomers are photosensitive and have a low storage lifetime, leading to a high cost of the precursor materials.

In the SLS method, the surface finish quality of the final part is constrained by the size of the powder, and often a subsequent machining step is needed to give an acceptable surface finish.

In the LOM technique, the dimensional control is limited due to staircase-edge effect caused by the stacking of the sheets.

There is therefore a need for a rapid prototyping technology capable of producing fully dense and functional parts directly from a computer-aided-design (CAD) model without the need for the time wasting intermediate processing steps. There is also a need for a technique which will allow other, possibly stronger or otherwise more suitable, materials to be used in rapid prototyping.

Reference [5] discloses a fabrication method involving photocurable plastic sheets, whereby regions of the sheets are cured by application of a laser beam. A technique for producing 3-D objects from a powder precursor has been proposed [6], with a vibration wiper blade being used to help apply the powder to a recipient surface. A stereolithography method involving polymer resin cured by a laser beam [7] uses an electric or magnetic field used to align particles within the polymer. Fabrication techniques in [8] and [9] make use of a gaseous precursor.

A fabrication method in which an object is formed as a plurality of successive laminae, the method comprising the repeated steps of:

(i) applying a sol precursor onto a recipient surface;

(ii) providing a temperature gradient along an application path of the precursor, so that the precursor is heated as it approaches the recipient surface and a sol-gel transition is initiated so that a gel layer is deposited on the surface; and (iii) locally heating regions of the gel layer by directing a light beam onto those regions of the deposited precursor, so that the locally heated regions transform to a solid material.

This invention also provides fabrication apparatus for fabricating an object as a plurality of successive laminae, the apparatus comprising:

(i) a precursor outlet for applying a sol precursor onto a recipient surface;

(ii) a heater for providing a temperature gradient alone an application path of the precursor, so that the precursor is heated as it approaches the recipient surface and a sol-gel transition is initiated so that a gel layer is deposited on the surface; and (iii) a directable light beam for locally heating regions of the deposited precursor so that the locally heated regions transform to a solid material.

This invention provides a new rapid prototyping process (embodiments of which will be referred to herein as laser gel manufacturing (LGM)) capable of efficiently producing high quality engineering parts, especially ceramic components for manufacturing industries.

The invention will now be described by way of example with reference to the accompanying drawing, throughout which like parts are referred to by like references, and in which:

FIG. 1 is a schematic diagram of a rapid prototyping apparatus.

Referring to FIG. 1, a "sol" precursor solution is supplied to a nozzle or outlet 10, from which it is sprayed onto a micro-positioning table 20 (which may comprise a conventional PZT stage and control electronics—not shown). A voltage source 30 is used to generate an electric field between the nozzle 10 and the table 20, so that droplets of the precursor solution emerging from the nozzle 10 are attracted towards the table 20. Also, a temperature gradient is maintained (e.g. by heating elements surrounding the table 20—not shown), so that the table is at a higher temperature than the nozzle 10. Under the influence of the temperature gradient and guided by the electric field, a sol-gel transition lakes place and a gel layer is thus deposited onto the table.

Examples of suitable precursor solutions are as follows:

Sol Precursor for the Deposition of Stabilised Zirconia ($Y_2O_3$—$ZrO_2$)

Precursor for yttria stabilised zirconia: $Y(O_2C_8H_{15})_3$ and $Zr(OC_4H_9)_4$ Solvent: propanol or butanol catalyst: ethanoic acid Sol Precursor for the Deposition of Alumina ($Al_2O_3$)

Precursor for alumina: $Al(OC_4H_9)_3$

Solvent: butanol and water catalyst: ethanoic acid or hydrochloric acid

A sol to gel transition can occur below 400° C., depending on the type of precursor and the solvent used. With the above examples, a sol to gel transition can occur between room temperature and about 250° C.

A galvoscanner 40 (a known electrically-driven mirror capable of fine, accurate and rapid motion) causes a laser beam 45 from a laser source 50 (focused if necessary by focusing optics 60 shown schematically in FIG. 1) the laser beam to move in the x-y direction (i.e. substantially in the plane of the table). Where the laser beam locally heats the deposited gel, that area of the gel crystallises into a ceramic material. In this way, a section of a solid object is being constructed as a result of the laser-gel interaction. In general, a coherent light source with a wavelength between ultraviolet and infrared may be used.

The galvoscanner is shown schematically, but of course would comprise (as well as at least one reflector or other directing optics such as lenses) a motor, a drive mechanism and a controller (e.g. a control computer) forming an overall drive means (not shown). In alternative embodiments, the beam could be directed by reconfiguring the relative positions of the directing optics.

The next section is built by lowering the table in the z-direction, followed by the deposition of the gel and the scanning of the laser beam onto the selected region of the gel, to construct the desired geometry through the laser-gel interaction. The above sequence is repeated to construct a 3-D object.

In addition, the LGM process can be applied to printing and marking applications, in which the gel material changes its optical properties (e.g. reflectivity and absorption coefficient) as a result of the laser-gel interaction, after it has been irradiated by the laser beam. The precursor used to form the gel in an electric field can be chemicals that are soluble in organic solvents or inorganic solvents. The chemicals can be natural dyes, metal alkoxides, nitrates, etc.

The process combines the technologies of sol-gel deposition [3], deposition techniques described in our copending application [4] and laser heating. It involves the preparation of sol and subsequent spraying of the sol across an electric field under a temperature gradient onto an object forming table to produce an uniform get deposit via a sol-gel transition induced by laser and/or other heating methods (e.g. by the temperature gradient mentioned above or by heating the nozzle 10). Subsequently, an intense laser beam is used to cause localised gel-ceramic phase transformation at selected regions of the gel deposit. A 3-D ceramic part can be constructed layer-by-layer through the manipulation of the movement of laser beam and object forming table. The laser beam scans the gel deposit on the object forming table according to the tool paths[1], thereby forming a cross section of an engineering part via gel-ceramic transformation. The object forming table is then moved one layer down to allow the next layer of gel to be deposited and selective regions of the gel is converted into the ceramic phase at selective regions using a scanning laser beam. The 3-D part is then constructed layer-by-layer with the finest details until the final object is formed.

[1] A 3-D computer aided design model of an engineering part is sliced into many 2-D sections. The geometries of each section are used to generate the tool paths to move the laser beam in a specific manner using a computer numerical control (CNC) system.

The time taken to build a volume of engineering parts is influenced by the processing parameters (such as sol composition, gel deposition rate, laser energy density, laser scan speed, scan spacing and table temperature and deposition rate, etc.). This method can reduce the amount of undesirable impurities in the engineering parts because it avoids the use of binder/sintering aids to provide the mechanical strength of the part during or after building. This process can be used in atmospheric or reduced atmospheric pressure.

Embodiments of this fabrication method can therefore combine the benefits of both laser aided transformation and the deposition processes of reference [4], offering the following advantages:

(1) good dimensional control due to a small volume change during processing
(2) excellent surface finish
(3) rapid manufacture of highly dense and/or porous engineering parts
(4) no support is required during the net shape forming process
(5) ease of extraction of parts after the end of the manufacturing process
(6) process can occur in open atmosphere for the production of ceramic oxide parts
(7) application to a wide range of ceramic materials e.g. $Al_2O_3$, $Y_2O_3$—$ZrO_2$ etc.
(8) simple, multicomponent oxides and doped-oxides parts can be manufactured with well controlled structure and composition.
(9) non-oxide components (such as those of metal, polymer and composites) can be manufactured in controlled atmosphere.
(10) simple/flexible equipment
(11) low cost and safe process using water soluble or organic soluble precursors
(12) manufacturing process can occur at low temperatures, e.g. 300–600° C. for stabilised zirconia based ceramic parts
(13) one-step processing without the need for further heat treatment
(14) possible to manufacture small, and precise engineering parts, as-well as large engineering parts.

In place of the sol precursor, aerosol or gaseous precursors could be used. In this case a similar apparatus would be used. The aerosol or gaseous precursor is passed through the nozzle or outlet 10 and directed onto the micro-positioning table 20. The voltage source provides an electric field so that the precursor is attracted towards the table. Local heating (by the light beam) forms areas of solid stable material. This sequence is repeated to produce a 3D object. Additional heating sources can be used to heat the object if required. The approach can be used to manufacture oxide and non-oxide parts. For example, in the fabrication of B4C parts, the gaseous precursor can comprise a mixture of boron trichioride, hydrocarbon and/or hydrogen gases. The gases can also be fed separately through a coaxial cylindrical nozzle.

Besides liquid precursors, the process and apparatus of FIG. 1 can also accommodate solid precursors such as powder for the manufacture of oxide and nonoxide parts. A carrier gas may be used to facilitate the transport of powder in the nozzle.

The process is not necessarily fixed within a confined space, but can be made portable so as to allow the manufacturing of large components and/or for repairs. Thick or thin films can be deposited onto planar substrates or onto substrates with complex geometry.

The process may be preformed in an open atmosphere for oxide materials or in a controlled atmosphere for non-oxide materials. The process can be performed at atmospheric or low pressure.

PUBLICATION REFERENCES

[1] T Grimm, Rapid News, Vol 4(4), p48, (1996)
[2] E A Griffin, D R Mumm and D B Marshall, American Ceramic Society Bulletin, Vol 75(7), p65 (1996)

[3] C J Brinker and G W Scherer, Sol-Gel Science, Academic Press Inc (1990)
[4] WO-A-97/21848
[5] EP-A-0 467 097
[6] DE-A-4 325 573
[7] WO-A-93/20993
[8] WO-A-93/02846
[9] WO-A-92/16343

What is claimed is:

1. Fabrication apparatus for fabricating an object as a plurality of successive laminae, the apparatus comprising:
    a nozzle comprising a precursor outlet for applying an aerosol precursor onto a recipient surface;
    a heater for providing a temperature gradient along an application path of the precursor, so that the precursor is heated as it approaches the recipient surface and a transformation initiated so that a material layer of transformed material is deposited on the recipient surface; and
    a directable light beam for locally heating regions of the material layer so as to further transform the locally-heated regions to a solid material.

2. Apparatus according to claim 1, wherein the object is formed on a movable substrate, and further comprising:
    a substrate drive mechanism for moving the substrate so that each most-recently-deposited precursor then forms a recipient surface at substantially the same position with respect to the application of precursor.

3. Apparatus according to claim 1, wherein the light beam comprises:
    a light source;
    light beam directing optics; and
    a directing optics drive mechanism for moving or reconfiguring the directing optics in order to direct the light beam.

4. Apparatus according to claim 1, further comprising:
    a precursor supply for supplying the precursor to the nozzle; and
    wherein the precursor is an aerosol precursor comprising a sol, and the transformation initiated is a sol-gel transition in forming a gel material layer.

5. Fabrication apparatus for fabricating an object as a plurality of successive laminae, the apparatus comprising:
    a nozzle comprising a precursor outlet for applying a gaseous precursor onto a recipient surface;
    a heater for providing a temperature gradient along an application path of the precursor, so that the precursor is heated as it approaches the recipient surface and a transformation initiated so that a material layer of transformed material is deposited on the recipient surface; and
    a directable light beam for locally heating regions of the material layer so as to further transform the locally-heated regions to a solid material.

6. Apparatus according to claim 5, wherein the object is formed on a movable substrate, and further comprising:
    a substrate drive mechanism for moving the substrate so that each most-recently-deposited precursor then forms a recipient surface at substantially the same position with respect to the application of precursor.

7. Apparatus according to claim 5, wherein the light beam comprises:
    a light source;
    light beam directing optics; and
    a directing optics drive mechanism for moving or reconfiguring the directing optics in order to direct the light beam.

* * * * *

UNITED STATES PATENT AND TRADEMARK OFFICE
CERTIFICATE OF CORRECTION

PATENT NO.    : 6,635,112 B1
DATED         : October 21, 2003
INVENTOR(S)   : Choy et al.

It is certified that error appears in the above-identified patent and that said Letters Patent is hereby corrected as shown below:

<u>Title page,</u>
Item [75], Inventors, please change "Issac Chang" to -- Isaac Chang --.

Signed and Sealed this

Tenth Day of February, 2004

JON W. DUDAS
*Acting Director of the United States Patent and Trademark Office*